United States Patent [19]
Kamimura

[11] 3,996,497
[45] Dec. 7, 1976

[54] PROTECTIVE CIRCUIT

[75] Inventor: Kazuhiko Kamimura, Yokohama, Japan

[73] Assignee: Sony Corporation, Tokyo, Japan

[22] Filed: Jan. 27, 1975

[21] Appl. No.: 544,327

[30] Foreign Application Priority Data

Jan. 31, 1974  Japan .............................. 49-12963

[52] U.S. Cl. .............................. 317/31; 330/207 P; 317/33 R
[51] Int. Cl.² ......................................... H02H 7/20
[58] Field of Search .............. 317/31, 33 R, 33 VR, 317/33 SC, 41; 330/207 P; 323/75 F, 75 A, 75 B, 75 K

[56] References Cited

UNITED STATES PATENTS

| | | | |
|---|---|---|---|
| 3,026,469 | 3/1962 | Wilbur et al. | 317/33 VR X |
| 3,048,718 | 8/1962 | Starzec et al. | 317/33 VR X |
| 3,449,680 | 6/1969 | Schilb et al. | 330/207 P |
| 3,500,074 | 3/1970 | Obenhaus | 317/41 X |
| 3,522,480 | 8/1970 | Routh et al. | 317/41 X |
| 3,536,958 | 10/1970 | Sondermeyer | 330/207 P X |
| 3,644,783 | 2/1972 | Snyder | 317/33 R X |
| 3,659,218 | 4/1972 | Haneda | 330/207 P |
| 3,681,659 | 8/1972 | Suzuki | 317/31 X |
| 3,691,427 | 9/1972 | Honda et al. | 317/31 |
| 3,731,153 | 5/1973 | Nishimoto | 330/207 P X |
| 3,814,988 | 6/1974 | Ito | 317/31 |
| 3,835,412 | 9/1974 | Honda et al. | 317/33 R X |

*Primary Examiner*—J D Miller
*Assistant Examiner*—Patrick R. Salce
*Attorney, Agent, or Firm*—Hill, Gross, Simpson, Van Santen, Steadman, Chiara & Simpson

[57] ABSTRACT

A protective circuit effective for use with an output capacitor less type transistor amplifier includes a load impedance detecting circuit and a detecting circuit for detecting an undesirable DC voltage applied to a load. The load impedance detecting circuit comprises first and second DC bridge circuits for detecting a load impedance, and the DC voltage detecting circuit comprises third and fourth DC bridge circuits. Both the load and amplifier are protected by outputs from the first through fourth bridge circuits so as to be free from a load-shorted state and an undesirable DC voltage.

13 Claims, 3 Drawing Figures

PROTECTIVE CIRCUIT

BACKGROUND OF THE INVENTION

1. Field of the Invention

This invention relates generally to a protective circuit and more particularly to a protective circuit which effectively protects a transistor amplifier from an overload.

2. Description of the Prior Art

In the art there has been proposed a protective circuit for a transistor amplifier in which a load voltage and a load current are compared to detect a load impedance and in which when the load impedance becomes lower than a predetermined value, the transistor amplifier is stopped in function.

If the load is a reactive one, a phase difference occurs between the load voltage and load current. Accordingly, an error operation may appear in the comparing operation. A protective circuit, which can avoid such an error operation caused by the phase difference by comparing the load voltage with the load current after they are rectified, has been also proposed by the same applicant of the application, in copending application, Ser. No. 382,139.

In general, it is well known in the art that an undesirable DC voltage produced at the output terminal of a load-direct-coupled type amplifier damages a load such as a speaker.

Up to now, there has been proposed no protective circuit which will protect an amplifier from a short-circuiting and undesirable DC voltage positively with a simple circuit construction.

SUMMARY OF THE INVENTION

In accordance with this invention, there is proposed a protective circuit for an amplifier which comprises a first bridge circuit which has one arm or side which includes a load, and whose other arms or sides include a diode and resistors and which is responsive to only one half cycle of an output signal, a second DC bridge circuit having one arm which includes a load and whose other arms include a diode and resistors and is responsive to only the other half cycle of the output signal, a first means for detecting unbalanced DC voltages of the first and second DC bridge circuits, the unbalanced DC voltages being inversely proportional to a load impedance, a third DC bridge circuit having one arm which includes a series circuit of a capacitor and a resistor and whose other arms include at least a diode and resistors so as to respond to a positive DC voltage in the output signal, a fourth DC bridge circuit having one arm which includes the series circuit of the capacitor and resistor and whose other arms include at least a diode and resistors so as to respond to a negative DC voltage in the output signal, second means for detecting unbalanced DC voltages of the third and fourth DC bridge circuits, the unbalanced DC voltages being proportional to an undesirable DC voltage in the output signal, and protective means so controlled by the outputs of the first and second detecting means as to cut off the operation of an output capacitorless type amplifier to free the load from the output signal supplied to an output terminal.

Accordingly, it is an object of the invention to provide a protective circuit which protects an amplifier when a load is shortcircuited and at the same time protects the load from an undesirable DC voltage.

It is another object of the invention to provide a protective circuit effective for use with an amplifier.

It is a further object of the invention to provide a protective circuit consisting of a first bridge circuit which detects a load impedance by comparing a load voltage with a load current and of a second bridge circuit which detects an undesirable DC voltage produced at the output terminal of the amplifier.

The other objects, features and advantages of the invention will become apparent from the following description taken in conjunction with the accompanying drawings.

DESCRIPTION OF THE PREFERRED EMBODIMENTS

The present invention will be hereinafter described with reference to the drawings.

Figure 1:
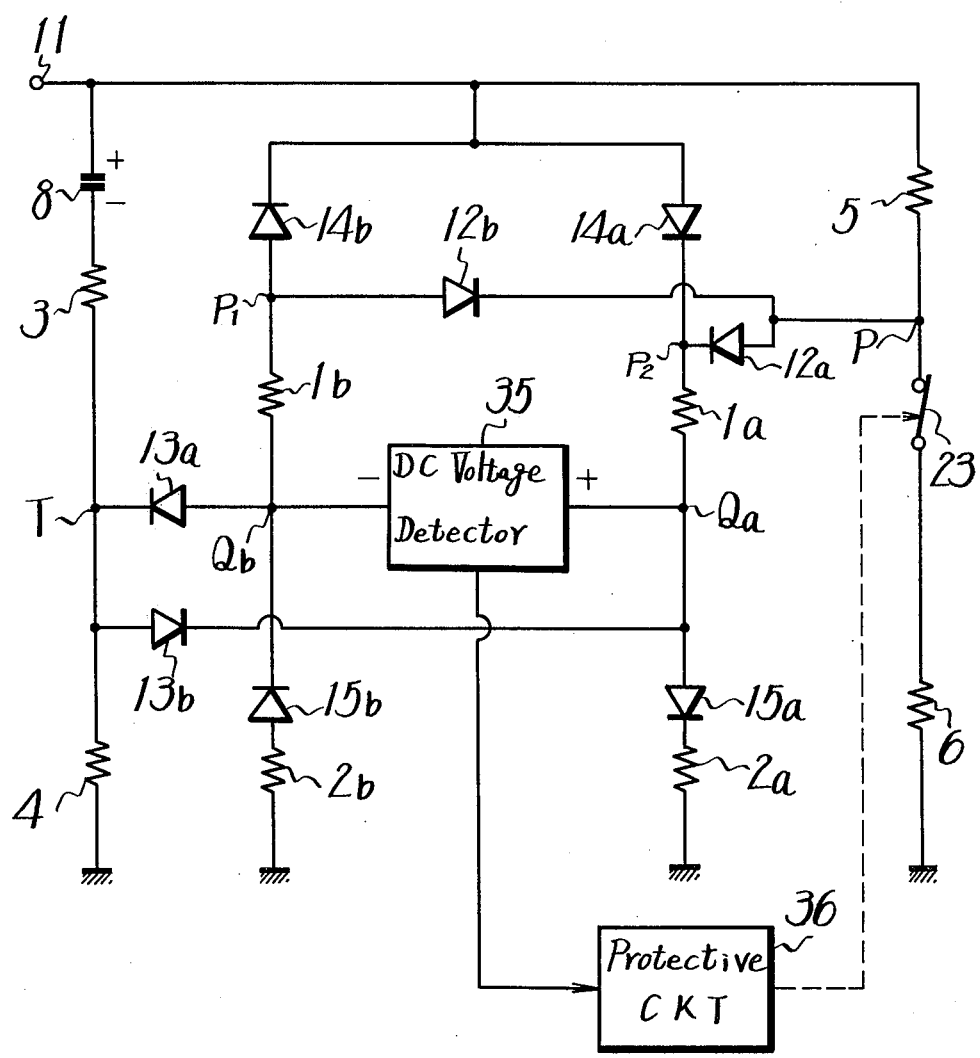
FIG. 1 is a connection diagram showing the main part of a protective circuit embodying the present invention.

FIG. 1 illustrates a fundamental circuit construction of the protective circuit according to the present invention, and includes terminal 11 which represents the input circuit of the protective circuit and the output terminal of an amplifier or the like (not shown) which output terminal 11 is supplied with an AC signal containing no DC component at normal state. The output terminal 11 is grounded through a resistor 5 used for detecting a load current, a switch 23 and a load 6 such as a speaker. Between the output terminal 11 and ground there is provided a load impedance detecting circuit which includes DC bridge circuits which operate at the positive and negative half cycles of an AC signal applied to the output terminal 11, respectively. The DC bridge circuit for the positive half cycle consists of a first series circuit of a diode $14a$, a resistor $1a$, a diode $15a$ and a resistor $2a$ connected between the output terminal 11 and ground, and of a second series circuit of the resistor 5 and the load 6. While the DC bridge circuit for the negative half cycle consists of a first series circuit of a diode $14b$, a resistor $1b$, a diode $15b$ and a resistor $2b$ connected between the output terminal 11 and ground, and of a second series circuit which is the same as the second series circuit of the resistor 5 and the load 6 for the former bridge circuit.

In this case, if it is assumed that the resistance values of the resistors $1a$, $2a$, $2b$, $1b$, 5 and 6 are taken as $R_{1a}$, $R_{2a}$, $R_{2b}$, $R_{1b}$, $R_5$ and $R_6$, the following equation (1) is established under the balanced state of the bridge circuits:

$$\left. \begin{array}{l} \dfrac{R_{1a}}{R_{2a}} = \dfrac{R_5}{R_6} \\[2mm] \dfrac{R_{1b}}{R_{2b}} = \dfrac{R_5}{R_6} \end{array} \right\} \qquad (1)$$

In other words, the resistance values $R_{1a}$, $R_{2a}$, $R_{2b}$, $R_{1b}$, $R_5$ and $R_6$ of the resistors 1a, 2a, 2b, 1b, 5 and 6 are selected to satisfy the above equation (1) under the balanced state.

In order to carry out the detection of an unbalanced state during the positive and negative half cycles with the respective bridge circuits commonly, a DC voltage detector 35 is inserted between a connection point Qa of the resistor 1a and the diode 15a and a point Qb of the resistor 1b and the diode 15b. The DC voltage detector 35 detects a terminal voltage between the points Qa and Qb, and supplies an output signal to a protective circuit 36 which is placed in an operative state when the terminal voltage increases over a predetermined value, for example, 0.6V. The DC voltage detector 35 may be formed, for example, of a single capacitor, and the protective circuit may be formed of, for example, a switching circuit using a transistor. When the output from the DC voltage detector 35 exceeds a predetermined value, the switching circuit or the protective circuit 36 operates to open the normally closed switch 23 and hence stops the supply of the output signal from the amplifier (not shown) to the load 6.

A diode 12b, which is inserted between a connection point $P_1$ of the diode 14b and the resistor 1b and a connection point P of the resistor 5 and the switch 23, and a diode 12a, which is inserted between a connection point $P_2$ of the diode 14a and the resistor 1a and the connection point P from a rectifier circuit for supplying a voltage at the unbalanced state of the respective DC bridge circuits to the DC voltage detector 35. It is, however, possible to omit one of the diodes 14a and 15a and one of the diodes 14b or 15b.

In the present invention, a detector circuit is provided for detecting an undesirable DC voltage which may appear at the output terminal 11. That is, a series circuit of a capacitor 8 and resistors 3 and 4 is connected between the output terminal 11 and ground, and a diode 13a is connected between a connection point T of the resistors 3 and 4 and the connection point Qb with the polarity shown in FIG. 1. Further, a diode 13b is connected between the connection points T and Qa with the polarity shown in the figure. The capacitor 8 has a sufficiently low impedance for any AC signal appearing at terminal 11 and is charged with the DC voltage when such may be produced at the output terminal 11.

A description will now be given of an operation of the protective circuit described as above in connection with FIG. 1. Since the protective circuit operates differently for the positive or negative half cycle as well as in response to the polarity of the output voltage at the output terminal 11, the operation of the protective circuit during the first positive half cycle will be described. At the normal operation during the positive half cycle (the impedance of the load being a regulated value), the DC bridge circuit formed by the diode 14a, resistor 1a, diode 15a, resistor 2a, resistor 5 and load 6 is in a balanced state, and accordingly, the potentials at the points Qa and P are equal to each other with the result that the DC voltage detector 35 produces an output of zero volts. Therefore, the protective circuit 36 is inoperative, the normally closed switch 23 remains in a closed state and the signal appearing at the output terminal 11 is fed to the load 6. Next, when the impedance of the load 6 becomes lower than a predetermined value (for example, the load 6 is short-circuited), the potential at the point P becomes lower in proportion to the impedance of the load 6 and becomes equal to ground potential when the load 6 is shortcircuited. In such a state, since the potential at the point Qa is higher than that at the point P, the DC voltage detector 35 detects a DC voltage with the polarity shown in FIG. 1. Thus, an output signal from the DC voltage detector 35 increases and then exceeds a predetermined value. At this time, the protective circuit 36 becomes operative to open the normally closed switch 23 so as to stop the supply of an output signal from the amplifier to the load 6. Thus, the operation of the amplifier is stopped.

The operation of the protective circuit will now be described for the negative half cycle of the signal. In the case where the impedance of the load 6 is greater than the predetermined value and the amplifier circuit is in normal operation, the DC bridge circuit formed of the series connectin of the diode 14b, resistor 1b, diode 15b and resistor 2b and the series connection of the resistor 5 and load 6 is in equilibrium or balanced state with the result that the potentials at the points Qb and P are equal to each other and the DC voltage across the DC voltage detector 35 is zero volts. As a result, the protective circuit 36 is inoperative and the normally closed switch 23 is remained as closed. However, if the impedance of the load 6 is lowered for some reason, the potential at the point P is changed to approach ground potential and becomes higher than that at the point Qb. Thus, across the DC voltage detector 36 there is obtained a DC voltage with the polarity shown in FIG. 1, the same as the case of the positive half cycle. Accordingly, when the terminal voltage across the DC voltage detector 35 exceeds the predetermined value, the protective circuit 36 becomes operative to open the normally closed switch 23 to stop the supply of any signal at the terminal 11 to the load 6. Thus, the operation of the amplifier is stopped.

Next, a protective operation of the circuit will be now described when an undesirable DC voltage may appear at the terminal 11. When no DC signal appears at the terminal 11, the terminal voltage across the capacitor 8 is zero volts, and hence the series connection of the capacitor 8 and the resistors 3 and 4 becomes equivalent to the circuit including no capacitor 8. Therefore, the DC bridge circuit formed of the series connection of the resistors 3 and 4 and the series connection of the diode 14a, resistor 1a, diode 15a and resistor 2a or the diode 14b, resistor 1b, diode 15b and resistor 2b is in balanced state. Accordingly, the potentials at the points T, Qa and Qb are equal to one another and the DC detector 35 produces an output of zero volts. When a positive DC voltage appears at the terminal 11 as may be caused by an abnormal state of the amplifier, the capacitor 8 is charged with the polarity shown in FIG. 1. At this time, the above DC bridge circuit becomes unbalanced and the potential at the point T becomes lower than that at the point Qa. Thus, the DC voltage detector 35 detects a DC voltage with the polarity shown in FIG. 1. When the terminal voltage across the DC voltage detector 35 exceeds a predetermined value, the protective circuit 36 becomes operative to open the normally closed switch 23.

When a negative DC voltage appears at the terminal 11, the capacitor 8 is charged with the reverse polarity to that shown in FIG. 1. At this time, the potential at the point T becomes higher than at the point Qb, and hence a current flows from the point T to the point Qb through the diode 13b and the DC voltage detector 35. Thus, the DC voltage detector 35 produces a DC voltage with the polarity shown in FIG. 1, and consequently the protective circuit 36 becomes operative to open the normally closed switch 23 so as to protect the load 6 from damage.

Figure 2:
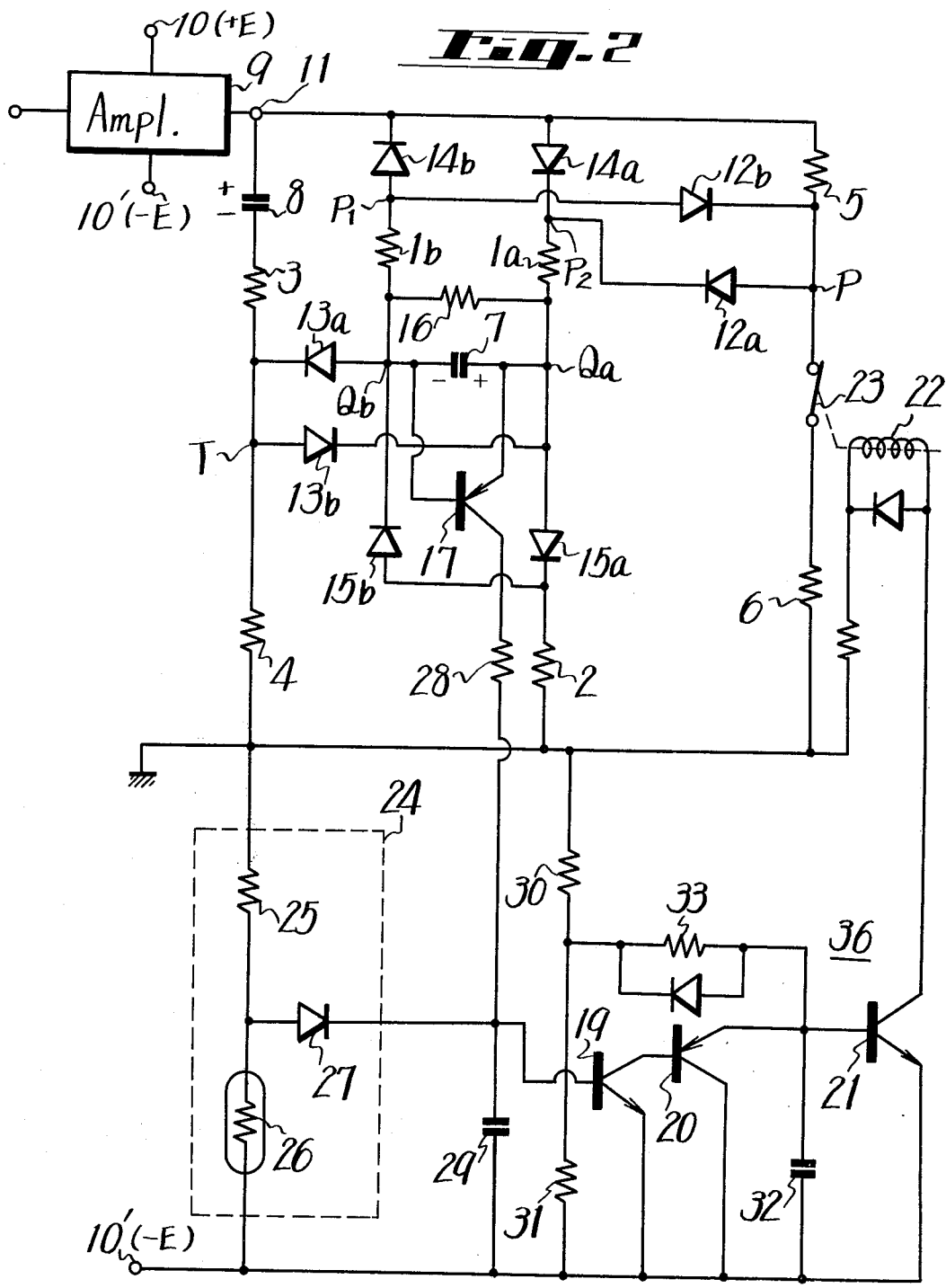
FIG. 2 is a connection diagram showing an embodiment in which the protective circuit of the present invention is used for an amplifier.

Another embodiment of the invention in which the protective circuit of the invention is used for an amplifier will be now described with reference to FIG. 2, in which the same reference numerals and symbols as those in FIG. 1 designate the same elements as those identified in FIG. 1. In FIG. 2, reference numeral 9 designates an OCL (output capacitorless) type amplifier which has a positive DC voltage source terminal 10 of +E, a negative DC voltage source terminal 10' of −E and the amplifier signal output terminal 11.

In the embodiment of FIG. 2, a capacitor 7 is connected between the points Qa and Qb for detecting a current and a resistor 16 is connected between the points Qa and Qb in parallel to the capacitor 7 for forming a discharging path for the capacitor 7. The capacitor 7, the resistor 16 and a switching transistor 17, whose emitter-base path is connected in parallel with the capacitor 7, form the DC voltage detector 35 of the embodiment of FIG. 1. Further, the resistors 1a and 1b used in the embodiment of FIG. 1 are replaced by a common single resistor 2 in the embodiment of FIG. 2. The protective circuit 36, which opens the normally closed switch 23 when a voltage is produced across the capacitor 7, will now be described in detail.

A transistor 19 is provided which is so connected that it is switched with a current flowing through the emitter-collector path of the transistor 17 through a resistor 28 when the transistor 17 becomes ON. In this case, a capacitor 29 connected in series to the resistor 28 is charged up. A transistor 20 is connected to the transistor 19 in Darlington connection manner. The transistor 20 is made ON when the transistor 19 is ON to discharge a capacitor 32 connected in parallel to the emitter-collector path of the transistor 20. A transistor 21 is provided whose base-emitter path is connected in parallel to the capacitor 32 so that the transistor 21 is switched with a terminal voltage across the capacitor 32. A relay winding 22 is inserted into the collector-emitter path of the transistor 21 which relay winding 22 is energized by the path from ground to the terminal 10' through the terminal 11 when the transistor 21 is ON to normally close the switch 23. But, when the transistor 21 becomes OFF, the relay winding 22 is deenergized to open the normally closed switch 23.

In FIG. 2, reference numeral 24 indicates a temperature compensation circuit in which a series connection of a resistor 25 and a positive thermosensitive resistor 26 are connected between the negative voltage terminal 10' and the ground, and the connection point therebetween is connected through a diode 27 to the base electrode of the transistor 19.

In the above circuit construction, when the impedance of the load 6 becomes lower than a predetermined value, for example, when both ends of the load 6 are short-circuited and hence the point P is grounded, the DC potential at the point Qa during the positive half cycle of the signal that appeared at the terminal 11 becomes higher than the DC potential at the point P. Thus, a current flows from the point Qa to the point P through the capacitor 7, resistor 1b and diode 12b to charge the capacitor 7 with the polarity shown in FIG. 2. Since the DC potential at the point Qb becomes lower than that at the point P during the negative half cycle of the signal at the terminal 11, a current flows from the point P to the point Qb through the diode 12a, resistor 1a and capacitor 7 to charge the capacitor 7 with the polarity shown in FIG. 2, similarly.

Accordingly, the transistor 17 is made ON, and hence the transistors 19 and 20 are made ON and the transistor 21 is made OFF. Thus, the relay winding 22 is deenergized, the normally closed switch 23 is opened thereby, and the load 6 is disconnected from the OCL type amplifier 9 to protect the amplifier 9.

When a positive DC voltage appears at the terminal 11, the capacitor 8 is charged with the polarity shown in FIG. 2 and the DC potential at the point T becomes lower than that at the terminal 11. As a result, a current flows from the terminal 11 to the point T through the diode 14a, resistor 1a, capacitor 7 and diode 13a to charge the capacitor 7 with the polarity shown in FIG. 2. While, when a negative DC voltage appears at the terminal 11, the capacitor 8 is charged with the polarity reverse to that shown in FIG. 2. Thus, a current flows from the point T to the terminal 11 through the diode 13b, capacitor 7, resistor 1b and diode 14b to charge the capacitor 7 with the polarity shown in FIG. 2, similarly. Thus, the transistor 17 becomes ON and the relay is winding 22 deenergized to open the normally closed switch 23 so as to disconnect the load 6 from the amplifier 9.

Therefore, it may be understood that at any undesirable case, the protective circuit 36 is made operative by the conduction of transistor 17 to protect the amplifier 9 or the load 6, respectively.

In the embodiment of FIG. 2, as the temperature of the amplifier 9 becomes high, the resistance value of the thermo-sensitive resistor 26 becomes also high. When the terminal voltage across the resistor 26 exceeds a predetermined value, the transistor 19 is made ON to make the transistor 21 OFF. Thus, the relay winding 22 is deenergized to open the normally closed switch 23.

In FIG. 2, reference numerals 30, 31 and 33 indicate resistors which form a time constant circuit in conjunction with capacitor 32. This time constant circuit is provided so as to mute a pop noise which may be caused by ON and OFF operations of a power source and which appear at the terminal 11. That is, the time constant circuit makes the transistor 21 OFF for a predetermined period of time from the ON and OFF of power source to open the normally closed switch 23.

Figure 3:
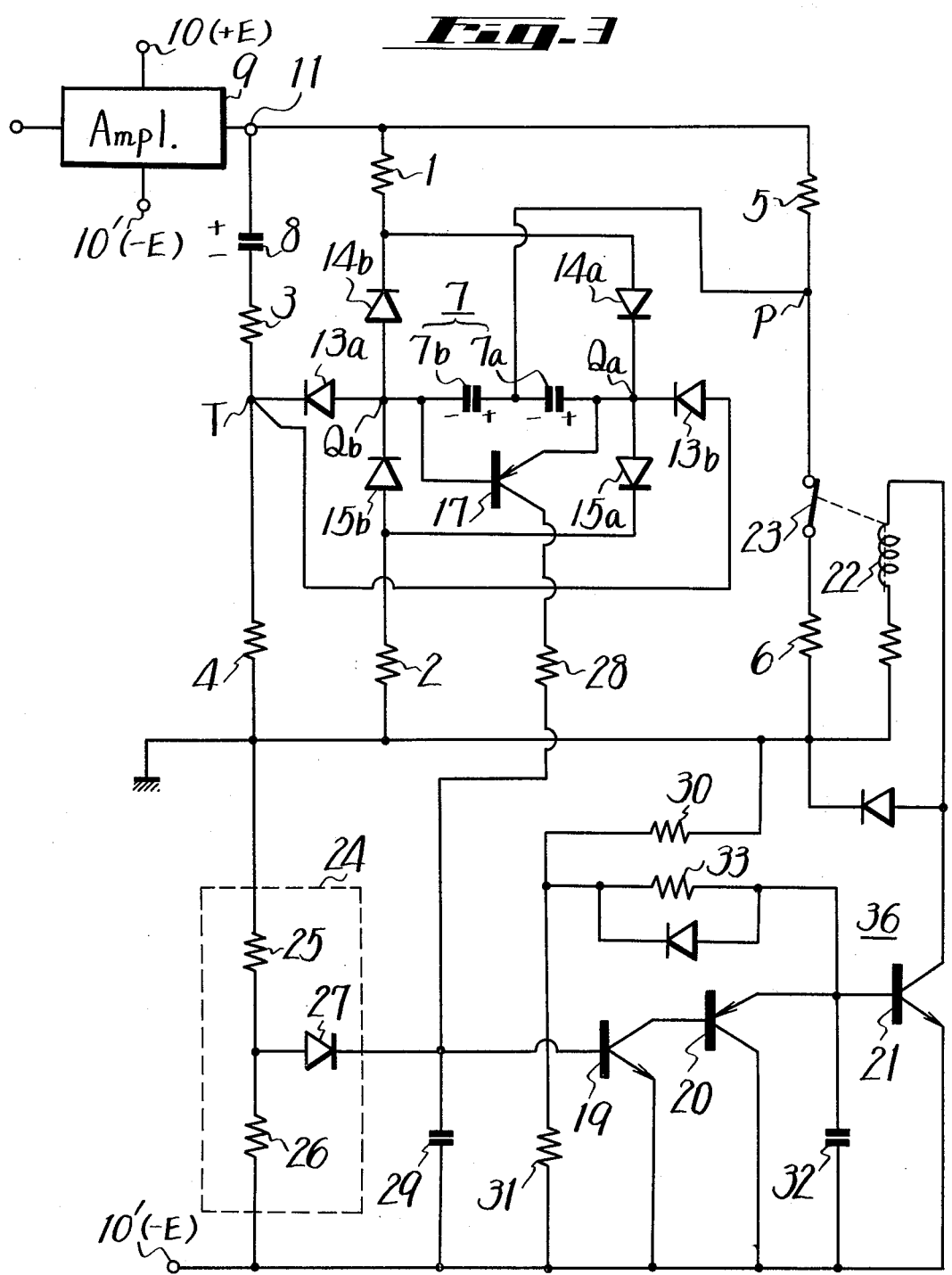
FIG. 3 is a connection diagram showing another embodiment in which the protective circuit of the present invention is used as that for another type of an amplifier.

FIG. 3 shows a further embodiment of the present invention, in which reference numerals which are the same as those used in FIGS. 1 and 2 represent the same elements. In the embodiment of FIG. 3, a single resistor 1 is used instead of the resistors 1a and 1b used in the embodiment of FIGS. 1 and 2 in common to the signals during the positive and negative half cycles, and the connection points between the diodes 14a and 15a and between the diodes 14b and 15b are shown by the same reference letters Qa and Qb in FIGS. 1 and 2, respectively. Further, the capacitor 7 is divided into two capacitors 7a and 7b which are connected in series with each other and between the connection points Qa and Qb, and the connection point between the capacitors 7a and 7b is connected to the point P. The diodes 12a and 12b used in the embodiments of FIGS. 1 and 2 are omitted.

An operation of the embodiment shown in FIG. 3 will be now described. It is assumed that the impedance of the load 6 becomes lower than the normal impedance thereof. During the positive half cycle, the potential at the point Qa becomes higher than that at the point P to charge the capacitor 7a with the polarity shown in FIG. 3, while during the negative half cycle the potential at the point Qb becomes lower than that at the point P to charge the capacitor 7b with the polarity shown in FIG. 3. As a result, the transistor 17 becomes ON to control the circuit as in the case of FIG. 2.

If a positive DC voltage appears at the terminal 11 for any reason, the capacitor 8 will be charged with the polarity shown in FIG. 3. Thus, a current may flow from the terminal 11 to the point T through the resistor 1, diode 14a, capacitor 7a, capacitor 7b and diode 13a to charge the capacitors 7a and 7b with the polarities shown in FIG. 3, similarly.

If a negative DC voltage appears at the terminal 11, the capacitor 8 will be charged with the polarity reverse to that shown in FIG. 3. Thus, a current will flow from the point T to the terminal 11 through the diode 13b, capacitors 7a, 7b, diode 14b and resistor 1 to charge the capacitors 7a and 7b with the same polarities as in the above case.

Accordingly, with the circuit shown in FIG. 3, at any case, the transistor 17 is made ON to deenergize the relay winding 22 so as to achieve the protective function, similarly.

In general, when the load 6 is a speaker, there is a tendency that a phase difference may appear between a voltage applied to the speaker and a current flowing through the speaker. In the meantime, since the second series circuit substantially consists of resistive elements, there may be produced a potential difference between the points P and Qa and/or Qb, due to the phase difference. Thus, the capacitors 7a and 7b are charged up which results in an error operation.

However, with the circuit shown in FIG. 3, even if, during the positive half cycle of the signal at the terminal 11 and in the case of a load voltage being in the reverse phase, the capacitor 7a is charged with the polarity shown in the figure, a current may flow from the ground to the point P through the resistor 2, diode 15b and capacitor 17b to charge the capacitor 7b with the polarity reverse to that in the figure. As a result, the charges of the capacitors 7a and 7b are cancelled with each other to avoid the error operation of the transistor 17. In other words, the circuit shown in FIG. 3 avoids the error operation even if there may be the above mentioned phase difference.

It may be apparent that many modifications and variations could be effected by one skilled in the art without departing from the spirit and scope of the novel concepts of the present invention.

I claim as my invention:

1. A protective circuit for an amplifier which is direct coupled to a load through a normally closed switch which includes:
   a. a load impedance detecting circuit; and
   b. a detecting circuit for detecting an undesirable DC voltage applied to said load;
   c. said load impedance detecting circuit comprising first and second DC bridge circuits for detecting said load impedance;
   d. means responsive to a detected impedance below a predetermined minimum value for opening said switch;
   e. said DC voltage detecting circuit comprising third and fourth bridge circuits; and
   f. means responsive to a detected voltage above a predetermined maximum value for opening said switch.

2. A protective circuit according to claim 1, which includes a temperature compensating circuit portin for opening said switch when the temperature of said amplifier increases above a predetermined point.

3. A protective circuit according to claim 1, which includes a time constant circuit in the circuit which opens said switch, said time constant circuit delaying the opening for a predetermined short period of time when said amplifier is turned ON and OFF.

4. A protective circuit according to claim 1, which includes means for sensing the temperature of said amplifier, said temperature sensing means having a resistance element whose resistance increases with an increase in operating temperature of the output of said amplifier, and means responsive to an increase in said operating temperature above a predetermined point for opening said switch.

5. A protective circuit according to claim 1, which includes a temperature compensating circuit portion for opening said switch when the temperature of said amplifier increases above a predetermined point, and further including a time constant circuit in the circuit which opens said switch, said time constant circuit delaying the opening for a predetermined short period of time when said amplifier is turned ON and OFF.

6. In an output capacitorless type amplifier an output terminal of which is coupled directly to a load, a protective circuit comprising:
   a. a first DC bridge circuit one side of which includes a load and the other sides of which include a diode and resistors which responds to only one half cycle of an output signal from said amplifier;
   b. a second DC bridge circuit one side of which includes the load and the other sides of which include a diode and resistors which responds to only the other half cycle of said output signal;
   c. first means for detecting any unbalanced DC voltage of said first and second DC bridge circuits, said unbalanced DC voltage being in inverse proportion to the load impedance;
   d. a third DC bridge circuit one side of which includes a series circuit of a capacitor and a resistor and the other sides of which include at least a diode and resistors which respond to a positive DC voltage in said output signal;
   e. a fourth DC bridge circuit one side of which includes said series circuit of said capacitor and resistor and the other sides of which includes at least a diode and resistors which respond to a negative DC voltage in said output signal;
   f. second means for detecting the unbalanced DC voltages of said third and fourth DC bridge circuits, said unbalanced DC voltage being proportional to an undesirable DC voltage in the output signal;
   g. protective means controlled by the outputs of said first and second detecting means to cut off said load from the output signal supplied to said output terminal;
   h. said first and second detecting means comprising a DC voltage detector and a plurality of diodes which detect the unbalanced DC voltages of said first through said fourth DC bridge circuits;
   i. a first resistor being connected between said output terminal and said load, said first resistor forming a first side of said first DC bridge circuit and said load forming a second side of said first DC bridge circuit, a series circuit of a first diode and second and third resistors connected between said output terminal and a reference point, an anode electrode of said first diode being connected at the side of said output terminal, said second and third resistors forming third and fourth sides of said first DC bridge circuit, respectively;

j. a series circuit of a second diode and fourth and fifth resistors being connected between said output terminal and the reference point, a cathode of said second diode being connected at the side of said output terminal, said fourth and fifth resistors forming first and second sides of said second DC bridge circuit, said first resistor and the load forming third and fourth sides of said second DC bridge circuit; and k. a capacitor and sixth and seventh resistors being connected in series between said output terminal and the reference point, said sixth and seventh resistors forming first and second sides of said third DC bridge circuit and said second and third resistors forming third and fourth sides of said third DC bridge circuit.

7. A protective circuit according to claim 6, wherein said sixth and seventh resistors form first and second sides of said fourth DC bridge circuit and said fourth and fifth resistors form third and fourth sides of said fourth DC bridge circuit.

8. A protective circuit according to claim 6, which includes a temperature compensating circuit portion for opening said switch when the temperature of said amplifier increases above a predetermined point.

9. A protective circuit according to claim 6, which includes a time constant circuit in the circuit which opens said switch, said time constant circuit delaying the opening for a predetermined short period of time when said amplifier is turned ON and OFF.

10. In an output capacitorless type amplifier an output terminal of which is directly connected to a load, a protective circuit comprising:

a. a first resistor connected between the output terminal and one terminal of said load whose other terminal is connected to a voltage reference point;

b. a second resistor, first and second diodes, and third resistor each of which is connected in series between said output terminal and said reference point, both anode electrodes of said first and second diodes being connected at the output side of said output terminal;

c. third and fourth diodes connected in parallel with said first and second diodes and of opposite polarities with respect to said first and second diodes;

d. a first capacitor, fourth and fifth resistors each of which is connected in series between said output terminal and said reference point;

e. a fifth diode whose anode electrode is connected to the connection point of said third and fourth diodes and whose cathode electrode is connected to the connection point of said fourth and fifth resistors, respectively;

f. a sixth diode whose cathode electrode is connected to the connection point of said first and second diodes and whose anode electrode is connected to the connection point of said fourth and fifth resistors, respectively;

g. second and third capacitors connected between the connection point of said first and second diodes and the connection point of said third and fourth diodes, the connection point of said second and third capacitors being connected to the connection point of said first resistor and the load; and h. means for producing a control signal when a voltage across said second and third capacitors become to a predetermined value for protecting said amplifier and load from destruction.

11. A protective circuit according to claim 10, which includes a temperature compensating circuit portion for delivering a control signal when the temperature of said amplifier increases above a predetermined point.

12. A protective circuit according to claim 10, which includes a time constant circuit which delays operation of said control signal for a predetermined short period of time when said amplifier is turned ON and OFF.

13. A protective circuit for an amplifier which is direct coupled to a load through a normally closed switch, which includes:

a. a first bridge circuit having one arm which includes said load and having other arms which include a diode and resistors and responsive to only one half cycle of an output signal from said amplifier;

b. a second DC bridge circuit having one arm which includes said load and having other arms which include a diode and resistors and responsive to only the other half cycle of said output signal from said amplifier;

c. first means for detecting an unbalanced DC voltage of said first and second DC bridge circuits, the unbalanced DC voltages being inversely proportional to said load impedance;

d. a third DC bridge circuit having one arm which includes a series capacitor and a resistor, and having another arm which includes at least a diode and resistors for responding to a positive DC voltage in said output signal;

e. a fourth DC bridge circuit having one arm which includes the series circuit of said capacitor and its associated resistor and having another arm which includes at least a diode and resistors for responding to a negative DC voltage and said output signal;

f. second means for detecting unbalanced DC voltages of said third and fourth DC bridge circuits, the unbalanced DC voltages being porportional to an undesirable DC voltage in said output signal; and g. protective means controlled by the outputs of said first and second detecting means for cutting off the operation of said amplifier by opening said switch.

* * * * *